United States Patent [19]

Hanrahan et al.

[11] Patent Number: 5,053,299
[45] Date of Patent: Oct. 1, 1991

[54] METHOD OF MAKING COLOR FILTER ARRAYS

[75] Inventors: Michael J. Hanrahan, Rochester; Kathleen S. Hollis, Dalton, both of N.Y.

[73] Assignee: Eastman Kodak Company, Rochester, N.Y.

[21] Appl. No.: 528,385

[22] Filed: May 25, 1990

[51] Int. Cl.$^5$ .................................................. G03F 9/00
[52] U.S. Cl. ............................................ 430/7; 430/30; 430/145; 430/293; 430/294; 430/321; 430/325
[58] Field of Search ................ 430/7, 4, 30, 293, 325, 430/321, 294, 23, 28, 145

[56] References Cited

U.S. PATENT DOCUMENTS

| | | | |
|---|---|---|---|
| 4,081,277 | 3/1978 | Brault et al. | 96/38.2 |
| 4,247,615 | 1/1981 | McGuckin et al. | 430/145 |
| 4,263,386 | 4/1981 | Datta et al. | 430/25 |
| 4,419,425 | 12/1983 | Ogawa et al. | 430/7 |
| 4,764,670 | 8/1988 | Pace et al. | 250/226 |

Primary Examiner—Charles L. Bowers, Jr.
Assistant Examiner—J. Weddington
Attorney, Agent, or Firm—Raymond L. Owens

[57] ABSTRACT

A method of forming a color filter array which includes forming only a single image mordant layer on a device and then exposing the mordant to a pattern representing an array of filter elements and developing areas of the mordant to provide separated filter elements. These filter elements are then selectively dyed different colors.

1 Claim, 1 Drawing Sheet

METHOD OF MAKING COLOR FILTER ARRAYS

BACKGROUND OF THE INVENTION

This invention relates to a method of making color filter arrays for a device such as an image sensor. The color filter has at least two systems of different colored filter elements each passing different colors of light. These filter elements are formed by coloring with dyes.

An example of a color imaging device which uses color filter arrays is shown in U.S. Pat. No. 4,081,277 and is used for recording video images. In this patent, the imaging device is a semiconductor layer which as a system of photosensitive elements. The color filter is provided directly on the system of photosensitive elements. The color filter is a single layer having systems of filter elements passing light of various colors, for example, red, green and blue. The filter elements are generally less than 50μm and are usually squares or stripes and are placed in registration with the photosensitive elements of the semiconductor layer.

The application of color filters as currently practiced is based upon sequentially coating, exposing, developing and dyeing a light-sensitive mordant or a mixture of a light-sensitive photoresist and mordant. In this way, three separate dyed regions, each containing subtractive dyes (i.e., cyan, magenta and yellow) are produced in registration with each other so that the red, green and blue filter elements are formed. This process requires three crucial aligning steps during exposure and appropriate process control so that voids between the filters which would result in white spots are avoided.

Unfortunately, the manufacture of color filters in the above-described manner may give rise to color defects and error in the registration of the filter elements with respect to the photosensitive elements. Moreover, there is a problem of dye diffusion in that the dye can easily travel outside the region to be colored.

SUMMARY OF THE INVENTION

It is therefore an object of this invention to provide a method of making color filter arrays which minimizes the above indicated problems.

The above object is achieved in a method of making color filter arrays for a device such as an image sensor or the like comprising the steps of: (a) forming only one transparent imagable mordant layer on the device; (b) exposing the imagable mordant to a pattern representing an array of filter elements and developing areas of the mordant to provide filter elements separated by the separation region; (c) coating a layer of positive photoresist over the filter element array; (d) exposing and developing the photoresist layer to obtain first window areas in the photoresist corresponding to selected filter elements; (e) providing a first dye through the first window areas to dye selected filter elements with a first color; (f) exposing and developing the photoresist layer to obtain second window areas in the photoresist corresponding to other selected filter elements; (g) providing a second dye through the second window areas to dye other selected filter elements with a second color; (h) repeating steps (f)–(g) over as many times as desired; and (i) removing the remaining portions of the photoresist layer.

The above method provides a number of advantages such as: (1) The only crucial exposure step is associated with the patterning of a single mordant layer. (2) Separation regions or gap sizes can be easily controlled by mask design. (3) The alignment for the exposure of the positive working photoresist is less critical due to the nature of the process. Under sized exposure areas can be designed into the mask so that a slight misalignment of the mask would still give proper dyed areas due to the presence of the separation regions within the mordant layer. (4) The coating of the photoresist on the patterned mordant will help to control lateral swelling of the image structure during dyeing. This will improve the resolution of the image sensor. (5) A single layer of mordant helps to maintain a planar surface and minimize white spots. (6) The process is effective on both rigid and flexible substrates and con advantageously be used in web coating applications.

DETAILED DESCRIPTION OF THE PREFERRED EMBODIMENTS

Figure 1A:
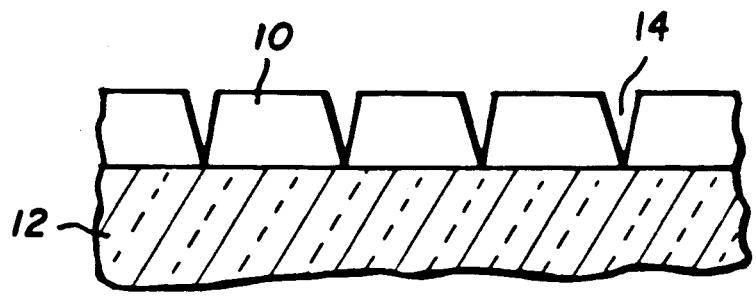
FIG. 1A–D shows a schematic cross-section of several stages in the process of making a color filter array in accordance with the present invention.

In accordance with this invention a color filter array is made using a two layer system. As shown in FIG. 1A an imagable mordant layer 10 is provided on a substrate 12. The photopatternable mordant is a mixture of a photosensitive diazo resin (Formula I) and a cationic mordant (Formula II) like that described in McGuckin and Cohen, U.S. Pat. No. 4,247,615.

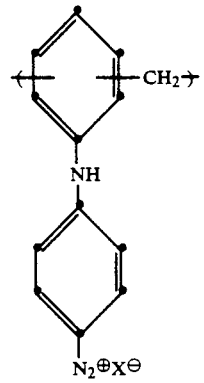

FORMULA I

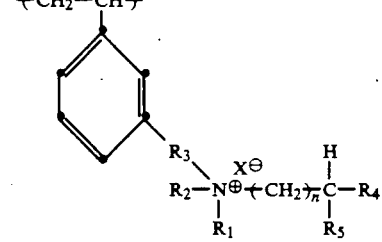

FORMULA II wherein:

$R_1$ and $R_2$, which may be the same or different, represents an aryl, an arylalkyl or an alkaryl group having from 6 to less than about 20 carbon aboms or an alkyl group having from 1 to about 10 carbon atoms;

$R_3$ is alkyl containing from 1 to about 3 carbon atoms;

n is 0, 1 or 2; $R_4$ and $R_5$ are either both hydrogen or, together with the carbon atom to which they are attached, form a saturated, unsaturated or aromatic ring system containing from 5 to 10 carbon atoms such as cyclohexyl, cyclopentyl, phenyl and naphthyl;

$X^{\ominus}$ is an acid anion.

A mask, not shown, is provided which defines the gaps or separation regions 14 between filter elements. By using this mask the imagable mordant is exposed to a pattern representing the array of filter elements. The separation regions 14 after being exposed are developed to provide the filter elements.

Figure 1B:
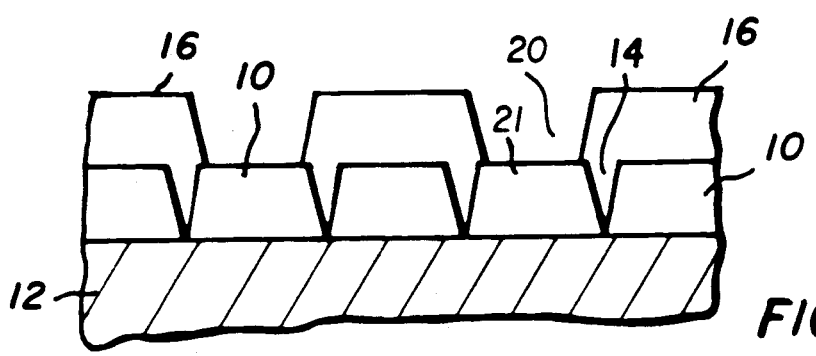
Figure 1C:
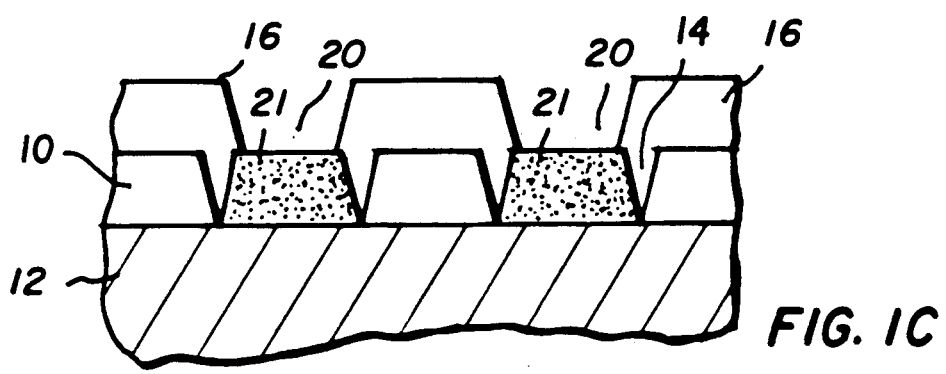
Figure 1D:
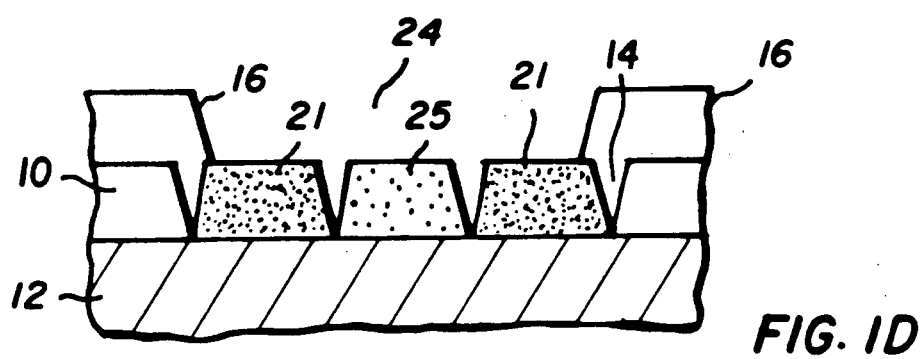

A positive-working photoresist layer 16 is then provided on the filter element. The positive-working photoresist layer can be made by spin coating any commercially available photoresist based upon the diazonaphthoquinone-novolac system. This layer is coated over the filter element array, it is exposed and developed to obtain a first set of first window areas 20 in the positive-working photoresist which correspond to selected filter elements 21 (see FIG. 1(B)). A first color dye is then provided through the openings 20 and dyes the selected filter elements a first color (see FIG. 1(C)). Any appropriate single dye color such as cyan, magenta or yellow or combination of these dyes to achieve red, green or blue may be used. The dyes should be anionic dye compounds such as those disclosed in Pace and Blood, U.S. Pat. No. 4,764,670. At this point, a protective layer may be applied to dyed regions to prevent dye being removed in subsequent processes or to prevent unwanted dye absorption in these same areas. As shown in FIG. 1(D), the photoresist layer is then exposed to open up a second set of windows 24 above other filter elements 25. A second color is then provided to dye filter elements 25. The above process is repeated as many times as desired to provide the desired number of different colored filter elements.

EXAMPLE 1

Fabrication of Patterned Color Filter Array with Two Dyes and Bilayer Process

Six 3" glass wafers were spin coated at 2000 rpm using a Headway spin coater, with a mixture of photosensitive diazo resin and a cationic mordant like that described in U.S. Pat. No. 4,764,670. The coatings were baked at 100° C. for 20 minutes in a Blue M convention oven. The coating was blanket exposed (not patterned) on a K&S contact aligner exposing tool for 30 seconds and rinsed with deionized water for 30 seconds while spinning. The coating was again baked at 100° C. for 20 minutes. A coating of KTI-820 photoresist was then applied to the above layer by spin coating at 5000 rmp. The wafers were dried in a vacuum over for 20 minutes. Each wafer was given a 20 second exposure using an Optoline resolution target mask and developed for 30 seconds with KTI-934 developer diluted to ½ of full strength. The wafers were rinsed for 30 seconds with deionized water. Two wafers were placed in a yellow dye bath for 4 minutes and rinsed with water. Two wafers were placed in a magenta dye bath for 4 minutes, rinsed with water, followed by a 1 minute treatment in a nickel acetate metallization bath and a second rinse. Two wafers were placed in a cyan dye bath for 4 minutes, rinsed with water, followed by a 1 minute treatment in a nickel acetate metallization bath and a second rinse. Each wafer was then coated with a protective layer and developed. Each wafer was then blanket exposed and developed with the KTI-934 developer as above. The wafers were then placed in a complementary dye bath to the previous treatment as illustrated in the following table.

| 1st dye | 2nd dye |
|---------|---------|
| yellow | magenta |
| yellow | cyan |
| magenta | yellow |
| magenta | cyan |
| cyan | yellow |
| cyan | magenta |

Optical micrographs showed good dye saturation and fidelity to the original mask pattern.

The invention has been described in detail with particular reference to a certain preferred embodiment thereof, but it will be understood that variations and modifications can be effected within the spirit and scope of the invention.

We claim:

1. In a method of making a color filter array for a device such as an image sensor or the like comprising the steps of:
    (a) forming only one transparent imagable mordant layer on the device;
    (b) exposing the imagable mordant to a pattern representing an array of filter elements and developing areas of the mordant to provide filter elements separated by the separation region;
    (c) coating a layer of positive photoresist over the filter element array;
    (d) exposing and developing the photoresist layer to obtain first window areas in the photoresist corresponding to selected filter elements;
    (e) providing a first dye through the first window areas to dye selected filter elements with a first color; and
    (f) exposing and developing the photoresist layer to obtain second window areas in the photoresist corresponding to other selected filter elements;
    (g) providing a second dye through the second window areas to dye other selected filter elements with a second color;
    (h) repeating steps (f)-(g) over as many times as desired; and
    (i) removing the remaining portions of the photoresist layer.

* * * * *